United States Patent
Elsayed-Ali et al.

(10) Patent No.: US 7,354,620 B2
(45) Date of Patent: Apr. 8, 2008

(54) METHOD FOR DEPOSITION OF INERT BARRIER COATING TO INCREASE CORROSION RESISTANCE

(75) Inventors: Hani E. Elsayed-Ali, Virginia Beach, VA (US); Edwin Waldbusser, Chesterfield, VA (US)

(73) Assignee: Controls Corporation of America, Virginia Beach, VA (US)

(*) Notice: Subject to any disclaimer, the term of this patent is extended or adjusted under 35 U.S.C. 154(b) by 369 days.

(21) Appl. No.: 11/041,929

(22) Filed: Jan. 26, 2005

(65) Prior Publication Data

US 2005/0126491 A1 Jun. 16, 2005

Related U.S. Application Data

(62) Division of application No. 10/341,506, filed on Jan. 14, 2003, now Pat. No. 6,863,731.

(60) Provisional application No. 60/419,146, filed on Oct. 18, 2002.

(51) Int. Cl.
*B05D 7/22* (2006.01)

(52) U.S. Cl. .................................. 427/237

(58) Field of Classification Search ............ 427/248.1, 427/233, 236, 237, 226, 228, 229, 106, 107
See application file for complete search history.

(56) References Cited

U.S. PATENT DOCUMENTS

| | | | |
|---|---|---|---|
| 4,708,884 A * | 11/1987 | Chandross et al. | ......... 427/579 |
| 5,281,557 A | 1/1994 | Yu | |
| 5,302,555 A | 4/1994 | Yu | |
| 5,352,487 A | 10/1994 | Klinedinst et al. | |
| 5,618,591 A * | 4/1997 | Bernstein, Jr. | .............. 427/544 |
| 5,728,425 A * | 3/1998 | Ebe et al. | ................ 427/248.1 |
| 5,824,375 A * | 10/1998 | Gupta | ......................... 427/569 |
| 6,004,397 A | 12/1999 | Park et al. | |
| 6,316,055 B1 | 11/2001 | Desu et al. | |
| 6,495,208 B1 | 12/2002 | Desu et al. | |

OTHER PUBLICATIONS

Jay J. Senkevich, "Communication", CVD of Nanoporous Silica, Chem. Vap. Deposition 1999, 5, No. 6, pp. 257-260.
Jay J. Senkevich et al., "Near-Room Temperature Thermal CVD of SiO2 Films", Chem. Vap. Deposition 1998, 4, No. 3, pp. 92-94.

(Continued)

*Primary Examiner*—Timothy Meeks
*Assistant Examiner*—Elizabeth Burkhart
(74) *Attorney, Agent, or Firm*—Miles & Stockbridge P.C.; Edward J. Kondracki

(57) ABSTRACT

The present invention reduces corrosion rates on metal surfaces, such as the interior surfaces of gas flow control components by depositing a chemically inert layer on the metal surface of the component and other associated parts of the component that are exposed to corrosive gases. The disclosed method provides for depositing a relatively chemically inert thin film such as silicon dioxide along the gas exposed surface areas of the metal surface thereby enhancing corrosion protection to the metal surfaces. The present invention can be used to deposit a chemically inert thin film at locations inside components that are outside a direct line of sight and at locations normally unreachable by a gas flowing through the components. The present invention does not require a vacuum system for the deposition of the corrosion-resistant thin film.

13 Claims, 3 Drawing Sheets

OTHER PUBLICATIONS

B. A. Scott et al., "Role of gas phase reactions in silicon chemical vapor deposition from monosilane", Appl. Phys. Lett. 55 (10), Sep. 4, 1989, pp. 1005-1007.

X.F. Yang et al., "Use of a sol-gel conversion coating for aluminum corrosion protection", Surface and Coating Technology 140 (2001), pp. 44-50.

Mohamed Atik et al., "Sol-Gel Thin Films for Corrosion Protection", Ceramics International 21 (1995), pp. 403-406.

Gerald Smolinsky et al., "LPCVD of Silicon Oxide Films in the Temperature Range 410 to 600 C From Diacetroxyditertiarybutoxysilane", Materials Letters, vol. 4, No. 5,6,7, Jul. 1986, pp. 256-260.

Y. Momose et al., "Potentiodynamic study of the corrosion protection of aluminum by plasma-polymerized coatings", Surface and Coatings Technology xx (2003) xxx-xxx.

Gilmar, P. Thim et al., "Sol-gel silica film preparation from aqueous solutions for corrosion protection", Journal of Non-Crystalline Solids 273 (2000), pp. 124-128.

Melanie Fallet et al., "Electrochemical behaviour of ceramic sol-gel coatings on mild steel", Journal of Non-Crystalline Solids 293-295 (2001), pp. 527-533.

Mauricio Simoes et al., "Some properties of protective sol-gel glass coatings on sintered stainless steels", Journal of Non-Crystalline Solids 273 (2000), pp. 159-163.

R. Lyer et al., "Kinetics of Low Pressure CVD Growth of SIO2 on InP and Si", J. Electrochem. Soc.: Solid-State Science and Technology, pp. 691-697.

A. C. Adams et al., "Characterization of Plasma-Deposited Silicon Dioxide", J. Electrochem. Soc: Solid-State Science and Technology, Jul. 1981, pp. 1545-1551.

L. R. Thompson et al., Corformal Step Coverage of Electron Beam-Assisted CVD of SiO2 adn Si3N4 Films, J. Electrochem Soc., vol. 131, No. 2, pp. 462-463.

T. V. Herak et al., "Low-temperature deposition of silicon dioxide films from electron cyclotron resonant microwave plasmas", J. Appl. Phys 65 (6), Mar. 15, 1989, pp. 2457-2463.

Surya R. Kalidindi et al., Analytical Model for the Low Pressure Chemical Vapor Deposition of SiO2 from Tetraethoxysilane, J. Electrochem. Soc., vol. 137, No. 2, Feb. 1990, pp. 624-628.

Barry Arkles et al., "Staged Development of Modified Silicon Dioxide Films", Journal of Sol-Gel Science and Technology 8, 465-469 (1997).

O. De Sanctis et al., "Behaviour in hot ammonia atmosphere of SiO2-coated stainless steels produced by a sol-gel procedure", Surface and Coatings Technology, 70 (1995), pp. 251-255.

K. Baba et al., "SiO2 coatings produced by ion beam assisted ECR-plasma CVD", Surface and Coatings Technology 74-75 (1995), pp. 292-296.

* cited by examiner

METHOD FOR DEPOSITION OF INERT BARRIER COATING TO INCREASE CORROSION RESISTANCE

RELATED APPLICATIONS

This application is a divisional of and claims priority to U.S. patent application Ser. No. 10/341,506 filed Jan. 14, 2003, now U.S. Pat. No. 6,863,731 issued Mar. 8, 2005, which claims priority to U.S. Provisional Patent Application Ser. No. 60/419,146 filed Oct. 18, 2002; this application is related to U.S. patent application Ser. No. 11/041,930 filed concurrently herewith, now abandoned, which is also a divisional of and claims priority to U.S. patent application Ser. No. 10/341,506 filed Jan. 14, 2003, now U.S. Pat. No. 6,863,731 issued Mar. 8, 2005.

FIELD OF THE INVENTION

The invention relates to chemical deposition and more particularly to the chemical deposition of an inert layer on the metal parts of components and associated adapted to be exposed to corrosive gases when in use.

BACKGROUND OF THE INVENTION

Many of the gases used in manufacturing tend to corrode metal parts of components and equipment. For example, gases used in microelectronic fabrication such as in thin film deposition and etching are highly corrosive gases. For example, chlorine ($Cl_2$), hydrochloric acid (HCl) and fluorine ($F_2$) are used in plasma etching, and dichlorosilane ($SiH_2Cl_2$), germane ($GeH_4$), and silicon tetrachloride ($SiCl_4$) are used in plasma deposition. The corrosive properties of these gases limit the life of the components and equipment, such as for example, gas flow control regulators, used to control the gases. The reaction products that are created when the gases interact with the surface of the gas flow control component may introduce contaminants into the gas stream. The continuous flow of these corrosive gases through a gas flow control component greatly reduces the life of the component. Thus, it is desirable and advantageous to provide a continuous coating of an inert, corrosion resistance substance on the surfaces of components that are exposed to corrosive gases to extend the life of such components.

SUMMARY OF THE INVENTION

The present invention is intended to reduce corrosion rates on metal parts and components, especially gas flow control components, by depositing a chemically inert layer on the metal parts. Thus, the metal parts of a flow control component and other associated parts of components that are exposed to corrosive gases are protected. The disclosed method provides for depositing a relatively chemically inert thin film along the metal parts adapted to be exposed to corrosive gasses thereby enhancing corrosion protection to the metal surfaces. The present invention can be used to deposit a chemically inert layer at locations inside flow control components that are outside a direct line of sight and at locations unreachable by a gas flowing through the flow control components. In addition, in a preferred embodiment, the present invention does not require vacuum systems for the deposition of the corrosion-resistant layer.

DETAILED DESCRIPTION

The inventive methods increase the corrosion resistance of components having interior surfaces by coating the inside surface of the component with $SiO_2$ (silicon dioxide or silica). In particular, low temperature chemical vapor deposition of $SiO_2$ from the thermal decomposition of commercially available, low toxicity reagents produces silicon films that have good uniformity and film properties.

DADBS is a preferred precursor of $SiO_2$, as it is relatively safe and easy to handle, and it is liquid at ambient conditions. The basic reactions used to create a layer of $SiO_2$ from a precursor are described below. These basic processes are similar to the processes used in semiconductor manufacturing, and the resulting coating on the inside surface of the treated components is contaminant-free to a level compatible to the semiconductor industry. The inventive methods are particularly adapted for, but not limited to, treating gas flow control components such as regulators, valves and the like through which corrosive gases may flow.

Basic Process for Forming Silicon Dioxide

A preferred method of acquiring the Silicon Dioxide ($SiO_2$) needed to create a silicon dioxide thin film is to decompose a $SiO_2$ precursor such as DADBS (diacetoxyditertiarybutoxysilane), or TEOS (tetraethoxysilane). DADBS deposits $SiO_2$ films at temperatures ranging from 400° C. to 600° C. The formation of $SiO_2$ from these precursors is due to the thermal decomposition of the precursor in a homogenous gas-phase reaction followed by a heterogeneous surface reaction with a metal surface, such as the inner surface of a gas flow control component. The process is shown in FIG. 1.

Figure 1:
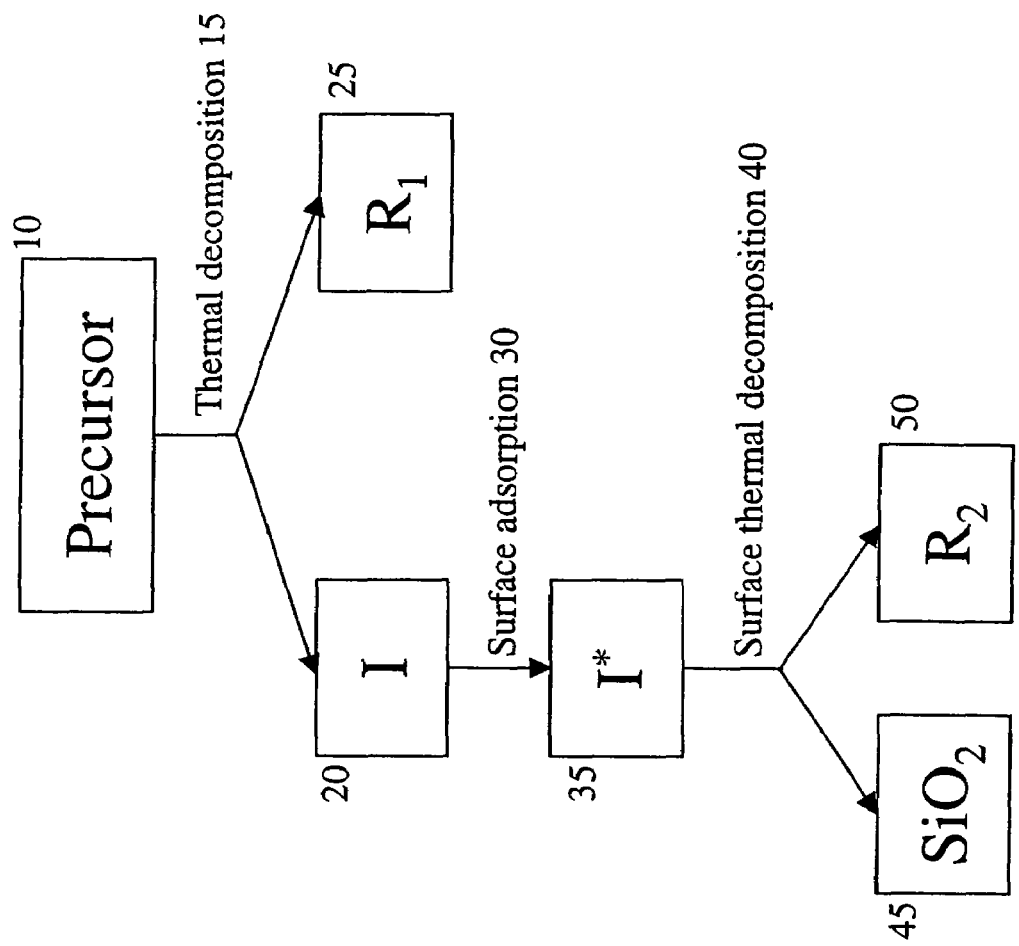
FIG. 1 is a block diagram illustrating the basic process for creating silicon dioxide layer.

As shown in FIG. 1, the process starts with precursor 10. Precursor 10 is thermally decomposed 15 into an intermediate product I (20) and, typically, by-products R (25). I is typically a gas phase intermediate containing Si and $O_2$. By-product R is typically a gas-phase organic by product. For example, when using DADBS as the precursor, the gas-phase reaction during thermal decomposition proceeds as follows:

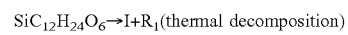

$SiC_{12}H_{24}O_6 \rightarrow I+R_1$ (thermal decomposition)

where I is an intermediate species in the gaseous phase containing Si and oxygen, and $R_1$ is an organic by-product also in the gas phase.

As shown in FIG. 1, the intermediate I adsorbs 30 onto a surface at a vacant surface site. This can be shown as:

$I+* \rightarrow I*$ (surface adsorption)

where * represents a vacant surface site, and I* represents the surface site with the adsorbed intermediate I. The adsorbed intermediate I* (35) thermally decomposes on the surface 40 to form $SiO_2$ (45) and, typically, a volatile organic by-product 50 in the gas phase. This process proceeds as follows:

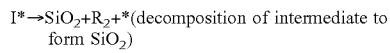

By-product $R_2$(50) typically may be readily pumped out or simply flushed out. Therefore, after pumping out any excess by-products, a silicon dioxide layer will be left deposited on surface *.

For DADBS, all reactions needed to deposit the $SiO_2$ will occur at approximately 450° C. The reaction temperature may be reduced even further by mixing in oxygen or ozone, although as oxygen is preferably present in the reagents used in the process. It is therefore not necessary to add any oxygen during the process.

Process for Silicon Dioxide Deposition

In current systems used to form a dielectric layer in semiconductor fabrication, deposition of $SiO_2$ is typically performed in a flowing vacuum system. However, this methodology has not been used to coat metal surfaces for corrosion protection of metal surfaces.

Figure 2:
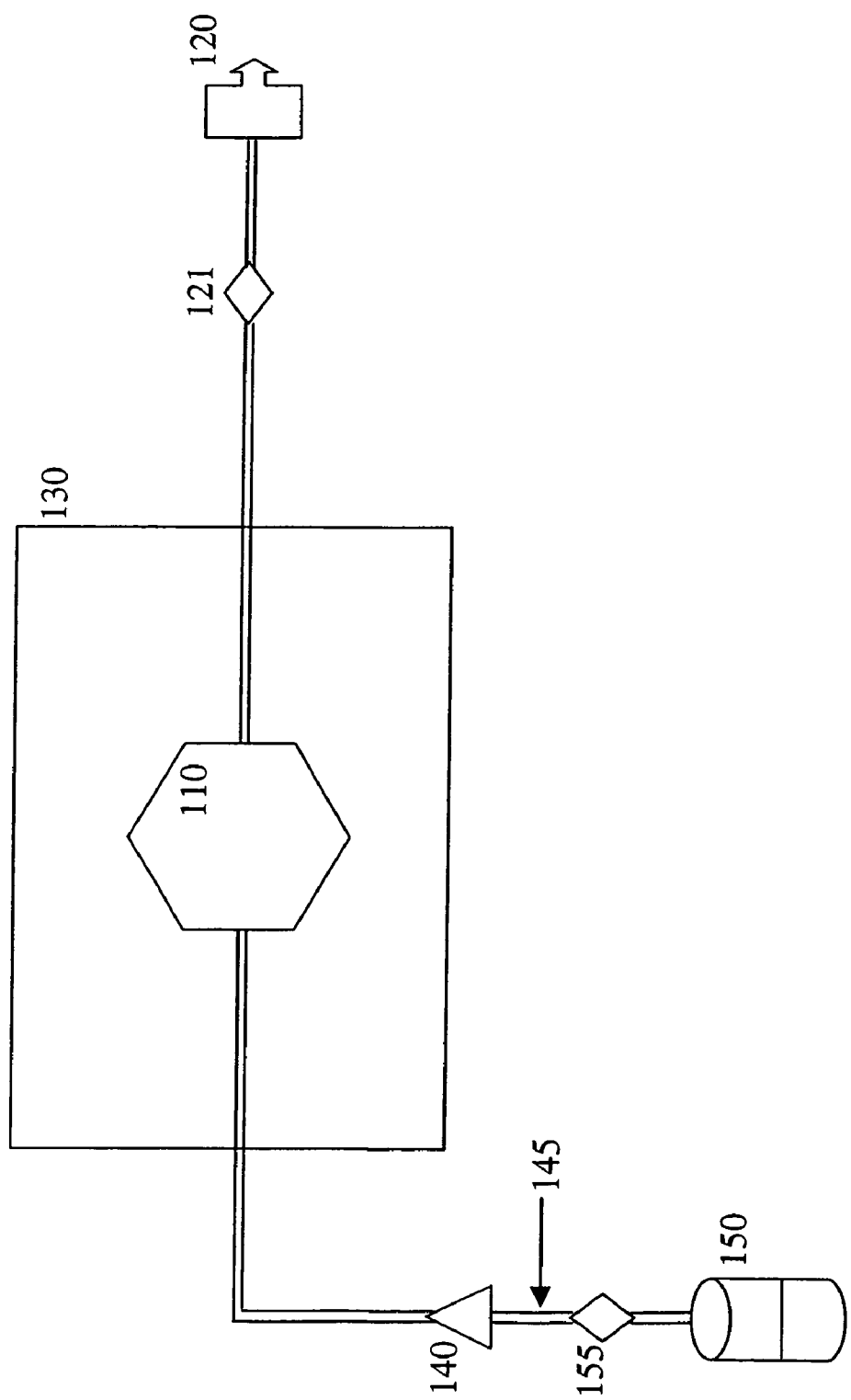
FIG. 2 is a block diagram illustrating a method for coating a gas flow component with a layer of silicon dioxide that uses a flow configuration in the formation of the silicon dioxide.

As shown in FIG. 2, component 110 having interior surfaces to be treated, such as, for example, a gas flow control regulator or valve, is connected to vacuum pump 120, loaded into heating oven 130, pumped down to a pressure of approximately 1 mTorr and heated until the inner walls of component 110 reach a desired deposition temperature. A precursor, for example DADBS, is placed in a container 150. For DADBS, reactions needed to deposit $SiO_2$ will occur at approximately 450° C., but the deposition temperature may be reduced by mixing in oxygen. The DADBS is in liquid form at ambient conditions but is easily evaporated by heating the container to temperatures about 50-100° C. Container 150 may be a round bottom stainless steel flask, for example. Before deposition, the vapor on top of the DADBS liquid is pumped out through a by-pass line 145. Container 150 has a flow controller 155 such as a needle valve to control the vapor flow rate. The DADBS vapor is introduced into heated component 110 with the flow rate monitored by a flow meter 140. At the end of the deposition process, the DADBS vapor flow is shut off and the heated component pumped out using pump 120 to remove residual gases. Pump 120 and valve 121 are also used to maintain vacuum integrity.

This is a complicated process requiring careful control of flow rate and in maintaining vacuum integrity while heating to approximately at least 450° C. and preferably approximately 500° C. However lower temperatures may be used if oxygen is added.

Component used as Mini-Chamber

Figure 3:
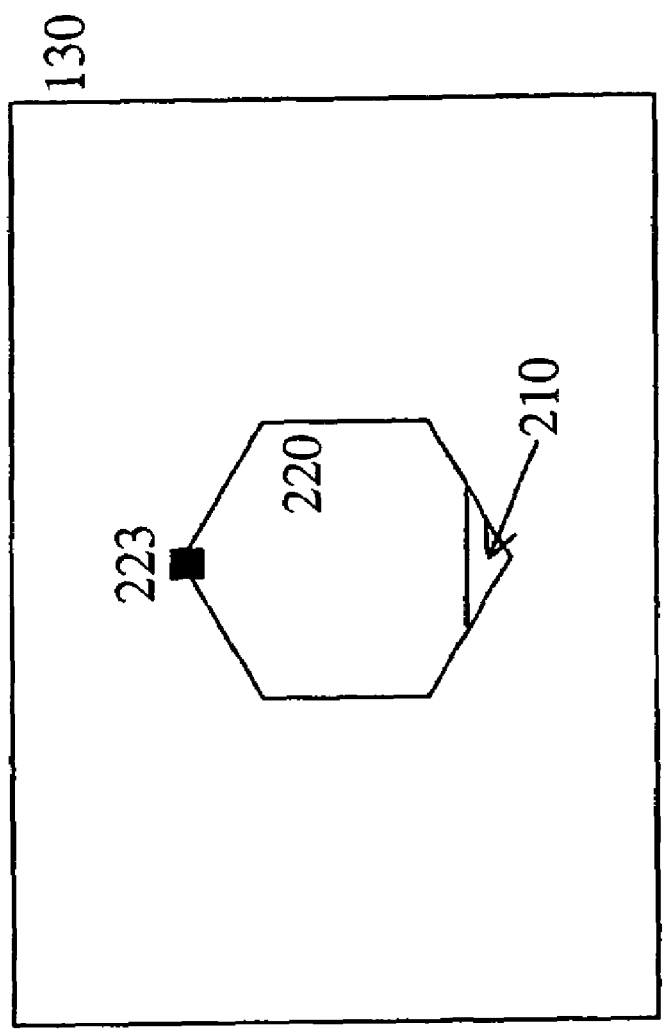
FIG. 3 is a block diagram illustrating a method of coating a component with silicon dioxide using the component as a mini-chamber that does not require a vacuum chamber.

An alternative, preferred, embodiment for the deposition of $SiO_2$ on components having interior surfaces, such as a gas flow control component is shown in FIG. 3. In this preferred embodiment, a vacuum system is not required. By this process, small diameter ports or other recesses inside the components that are not within the flow path are coated during the process.

As shown in FIG. 3, a measured quantity of the $SiO_2$ precursor 210 is introduced in the component itself 220, which may be a gas flow control regulator or valve having interior surfaces or parts. This is done by simply adding a measured volume of DADBS, or other $SiO_2$ precursor, to or within the component body 220 and sealing it so that the DADBS remains trapped inside it while the temperatures needed to initiate the decomposition reaction and $SiO_2$ deposition are reached. The component 220 is sealed, using seal 223 for example, thereby transforming the component into a sealed mini-chamber. The component may be sealed using brass connections, for example. It is possible for a gas flow component to act as a mini-chamber, because gas flow control components, such as regulators, can withstand many atmospheres of internal gas pressure. When this mini-chamber is heated to about 450° C. and preferably approximately 500° C. in oven 130, the component is filled with high pressure DADBS, or other precursor. The precursor starts to evaporate and fill the component at temperatures below 100° C. As the temperature of the inner walls of component 220 increases to 450° C., the DADBS molecules collide with the inner walls of component 220, thereby forming a thin film of $SiO_2$ on the inner wall surface upon their decomposition. The reaction process may be carried out at temperatures between approximately 400° C. and 600° C.

Coating of intricate and/or dead ended flow paths or recesses is assured by placing the precursor at or near those locations.

In this preferred embodiment of the present invention, several advantages are achieved. The process provides for a relatively chemically inert surface that enhances corrosion protection for the surface. The coating is deposited uniformly on inside surfaces and part of a flow control component with no need for a direct line of sight, and can be deposited at surface locations otherwise unreachable by a gas flowing through the flow control component. The coating can be deposited at temperatures less than 500° C., and generally in the range of 450° C. to 600° C. One embodiment of the inventive process does not require a vacuum system for deposition.

In addition, the inventive process involves materials that do not present serious hazards to an operator, and technicians can perform the inventive process safely and with high reliability.

While the invention has been described in conjunction with specific embodiments thereof, it is evident that many alternatives, modifications and variations will be apparent to those skilled in the art. Accordingly, the preferred embodiments of the invention as set forth herein, are intended to be illustrative, not limiting. Various changes may be made without departing from the spirit and scope of the invention as set forth herein and defined in the claims.

What is claimed is:

1. A method of coating an interior metal surface of a gas flow control component with a corrosion resistant thin film, comprising the steps of:

placing a predetermined amount of a corrosion resistant precursor gas within the interior of the gas flow control component;

sealing the precursor gas within the interior of the gas flow control component;

placing the gas flow control component inside an oven;

heating the gas flow control component inside the oven sufficiently to cause the precursor gas to thermally decompose into a gas phase intermediate product and a gas phase organic product and form a thin corrosion resistant film on the interior metal surface of the gas flow control component when the precursor gas thermally decomposes and forms an absorbate on the interior metal surface of the gas flow control component; and withdrawing the gas phase organic product from the interior of the gas flow control component.

2. The method of claim 1, wherein said oven is heated to a temperature of at least 100° C.

3. The method of claim 1, wherein said precursor is a $SiO_2$ precursor.

4. The method of claim 3, wherein said precursor is DADBS.

5. The method of claim 1, wherein said corrosion resistant thin film is comprised of silicon dioxide.

6. The method of claim 1, wherein said component is heated to between approximately 400° C. and 600° C.

7. The method of claim 1, wherein said precursor is mixed with an oxygen or ozone producing agent.

8. The method of claim 1, wherein the thin film is formed by vapor deposition.

9. The method of claim 1, wherein placing the predetermined amount of the precursor gas within the interior of the gas flow control component comprises:

pumping vapor out of a container containing a liquid precursor into the interior of the gas flow control component.

10. The method of claim 9, wherein the container is heated to cause the precursor to change to vapor form.

11. The method of claim 9, wherein the pumping of the vapor into the interior of the gas flow control component is controlled.

12. The method of claim 1 further comprises:

controlling pressure within the gas flow control component.

13. The method of claim 12, wherein the controlling pressure within the gas flow control component comprises:

pumping the pressure within the gas flow control component down to about 1 m Torr.

* * * * *